(12) United States Patent
Sugita et al.

(10) Patent No.: US 11,817,335 B2
(45) Date of Patent: Nov. 14, 2023

(54) METHOD AND SYSTEM FOR INSPECTING PROCESSING APPARATUS

(71) Applicant: Tokyo Electron Limited, Tokyo (JP)

(72) Inventors: Kippei Sugita, Miyagi (JP); Kenji Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 451 days.

(21) Appl. No.: 17/010,885

(22) Filed: Sep. 3, 2020

(65) Prior Publication Data

US 2021/0074564 A1     Mar. 11, 2021

(30) Foreign Application Priority Data

Sep. 6, 2019    (JP) ................ 2019-163018

(51) Int. Cl.
| | |
|---|---|
| *G01N 21/25* | (2006.01) |
| *G01N 21/45* | (2006.01) |
| *H01L 21/67* | (2006.01) |
| *G01N 21/95* | (2006.01) |
| *G01B 5/00* | (2006.01) |
| *G01K 11/125* | (2021.01) |

(52) U.S. Cl.
CPC ...... *H01L 21/67253* (2013.01); *G01B 5/0014* (2013.01); *G01K 11/125* (2013.01); *G01N 21/25* (2013.01); *G01N 21/45* (2013.01); *G01N 21/9501* (2013.01); *H01L 21/67248* (2013.01); *H01L 21/67288* (2013.01)

(58) Field of Classification Search
CPC ........ H01L 21/67253; H01L 21/67248; H01L 21/67288; G01B 5/0014; G01K 11/125; G01N 21/25; G01N 21/45; G01N 21/9501

See application file for complete search history.

(56) References Cited

FOREIGN PATENT DOCUMENTS

| | | | | |
|---|---|---|---|---|
| JP | 0856774 B1 | * | 1/1997 | ............... G03F 7/16 |
| JP | 2018-054500 A | | 4/2018 | |
| KR | 20210059620 A | * | 11/2020 | ....... H01L 21/68771 |

\* cited by examiner

*Primary Examiner* — David P Porta
*Assistant Examiner* — Fani Polyzos Boosalis
(74) *Attorney, Agent, or Firm* — Pearne & Gordon LLP

(57) ABSTRACT

A system configured to inspect a processing apparatus includes a temperature adjusting device configured to adjust a temperature of a component within a processing chamber of the processing apparatus; a light source configured to emit measurement light; multiple optical elements configured to output the measurement light emitted from the light source to the component within the processing chamber of the processing apparatus as output light and configured to receive reflected light from the component during a temperature adjustment of the component by the temperature adjusting device; and a controller configured to measure temperatures of the component at measurement points respectively corresponding to the multiple optical elements based on the reflected light, and make a determination upon abnormality of the processing apparatus based on comparisons of the temperatures of the component at the respective measurement points.

21 Claims, 14 Drawing Sheets

METHOD AND SYSTEM FOR INSPECTING PROCESSING APPARATUS

CROSS-REFERENCE TO RELATED APPLICATION

This application claims the benefit of Japanese Patent Application No. 2019-163018 filed on Sep. 6, 2019, the entire disclosure of which is incorporated herein by reference.

TECHNICAL FIELD

The various aspects and embodiments described herein pertain generally to a method and a system for inspecting a processing apparatus.

BACKGROUND

Patent Document 1 describes a system of detecting a positional relationship between a processing apparatus and a wafer by using optical interference. This system is for use in the processing apparatus having a placing table configured to place the wafer having a disk shape thereon and a focus ring configured to surround the placing table. This system is equipped with a light source configured to produce measurement light; three or more focusers; a driving unit configured to move each of the focusers; and an operation device. Each focuser outputs the measurement light as output light and receives reflected light. The driving unit allows each focuser to scan a scanning range from the focus ring to the wafer placed on the placing table. The operation device calculates, for each focuser, a positional relationship between the focus ring and the wafer placed on the placing table based on the reflected light in the scanning range.

Patent Document 1: Japanese Patent Laid-open Publication No. 2018-054500

SUMMARY

In one exemplary embodiment, a system configured to inspect a processing apparatus is provided. The system includes a temperature adjusting device, a light source, multiple optical elements, a light receiving element and a controller. The temperature adjusting device is configured to adjust a temperature of a component within a processing chamber of the processing apparatus. The light source is configured to emit measurement light. The multiple optical elements is configured to output the measurement light emitted from the light source to the component within the processing chamber of the processing apparatus as output light and configured to receive reflected light from the component during a temperature adjustment of the component by the temperature adjusting device. The light receiving element is configured to receive the light from the multiple optical elements and measures a spectrum of the light. The controller is configured to calculate temperatures of the component at measurement points respectively corresponding to the multiple optical elements based on the spectrum of the light measured by the light receiving element, and makes a determination upon abnormality of the processing apparatus based on comparisons of the temperatures of the component at the respective measurement points.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
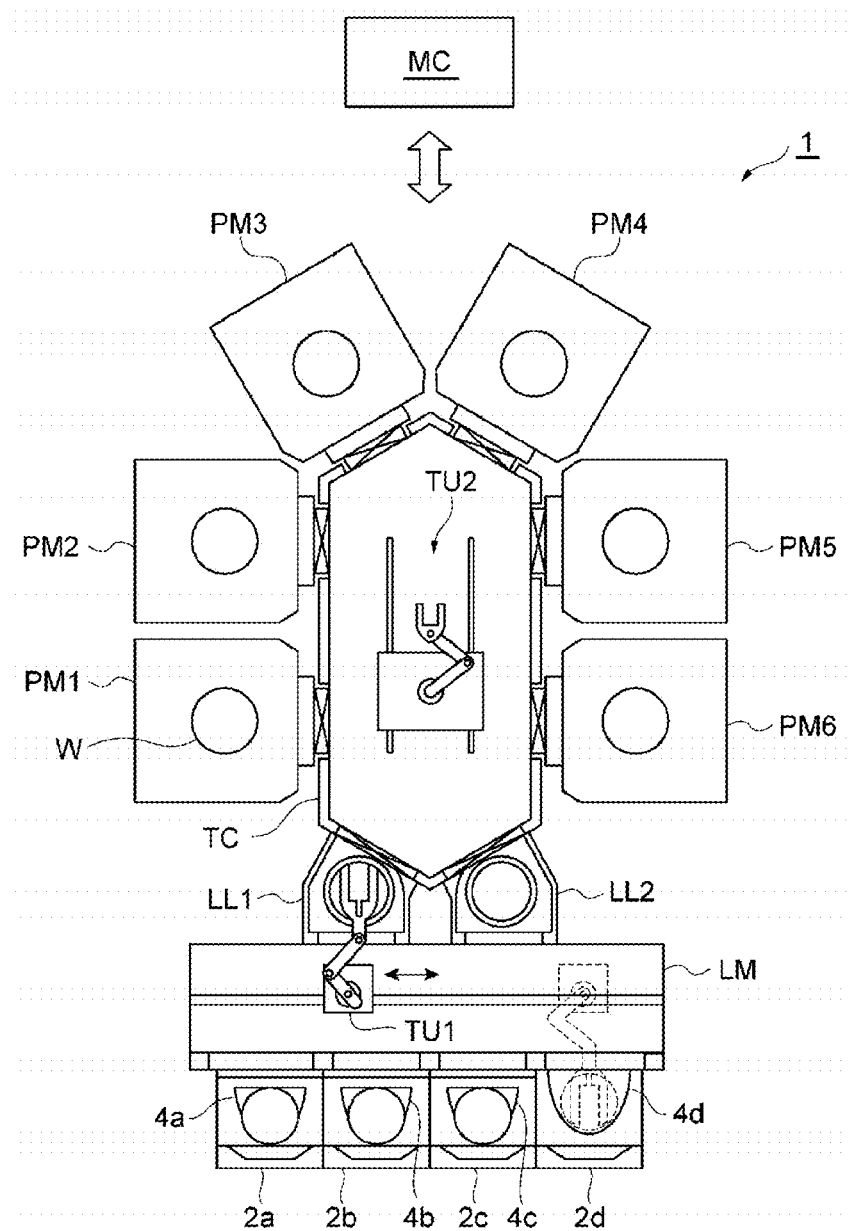
FIG. 1 is a diagram illustrating an example of a processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In the system described in Patent Document 1, a positional relationship between components within a processing chamber of the processing apparatus can be investigated. Thus, by using the system disclosed in Patent Document 1, abnormality of the apparatus such as an assembly error of a component therein may be determined. Through only the detection of the positional relationship, however, the abnormality of the apparatus may not be inspected accurately.

The present disclosure provides a system and a method capable of determining abnormality of a processing apparatus accurately.

According to one exemplary embodiment, there is provided a system configured to inspect a processing apparatus. The system includes a temperature adjusting device, a light source, multiple optical elements, a light receiving element and a controller. The temperature adjusting device is configured to adjust a temperature of a component within a processing chamber of the processing apparatus. The light source is configured to emit measurement light. The multiple optical elements is configured to output the measurement light emitted from the light source to the component within the processing chamber of the processing apparatus as output light and configured to receive reflected light from the component during a temperature adjustment of the component by the temperature adjusting device. The light receiving element is configured to receive the light from the multiple optical elements and measures a spectrum of the light. The controller is configured to calculate temperatures of the component at measurement points respectively corresponding to the multiple optical elements based on the spectrum of the light measured by the light receiving element, and makes a determination upon abnormality of the processing apparatus based on comparisons of the temperatures of the component at the respective measurement points.

According to this system, the measurement light is outputted to the component within the processing chamber of the processing apparatus from each of the plurality of optical elements during the temperature adjustment of the component by the temperature adjusting device. A temperature of the component at the measurement point corresponding to the optical element is calculated based on the reflected light of the component at each measurement point. The abnormality of the processing apparatus is determined based on the comparisons of the temperatures of the component at the respective measurement points. In determination of a positional relationship of the component, a slight position deviation may be detected according to a determination threshold value, which might not be regarded as the abnormality of the processing apparatus. Further, in the determination of the positional relationship of the component, a thermal expansion of the component caused by a temperature rise or a temperature decline is not considered. According to this system, since the abnormality of the processing apparatus is detected in the middle of adjusting the temperature of the component, the abnormality of the processing apparatus is determined in consideration of the thermal expansion of the component by heating or cooling as well. Therefore, as compared to a system which detects only the positional relationship of the component, this system of the exemplary embodiment is capable of determining the abnormality of the processing apparatus accurately.

In the exemplary embodiment, the component may be at least one of a placing table configured to place thereon a target object having a disk shape, a focus ring configured to surround the placing table, or an upper electrode disposed above the focus ring, and the component is made of silicon.

In this case, this system is capable of determining abnormality of the processing apparatus caused by at least one of the placing table, the focus ring or the upper electrode.

In the exemplary embodiment, the controller may compare the temperatures of the component at the respective measurement points, and may make a determination that the processing apparatus is abnormal when a difference between the temperatures is equal to or larger than a threshold value. In this case, this system is capable of determining the abnormality of the processing apparatus by using the threshold value.

In the exemplary embodiment, the temperature adjusting device may be a device configured to form plasma within the processing chamber of the processing apparatus. In this case, this system is capable of applying heat to the component by using the plasma of the processing apparatus.

In the exemplary embodiment, the controller may measure, based on the reflected light, positions of the component in a height direction for the measurement points corresponding to the multiple optical devices. The controller may make a determination upon the abnormality of the processing apparatus based on comparisons of the positions of the component in the height direction at the respective measurement points. When it is determined that the processing apparatus has no abnormality based on the positions of the component in the height direction, the controller may make the determination upon the abnormality of the processing apparatus based on the comparisons of the temperatures of the component at the respective measurement points. In this case, this system is capable of determining abnormality of the processing apparatus in two stages.

According to another exemplary embodiment, a method includes irradiating measurement light to multiple measurement points of a component within a processing chamber of a processing apparatus during a temperature adjustment of the processing chamber; and calculating temperatures of the component at the respective measurement points based on reflected light from the component, and making a determination upon abnormality of the processing apparatus based on comparisons of the temperatures of the component at the respective measurement points. According to this method, the abnormality of the processing apparatus can be determined accurately, as compared to a method in which only a positional relationship of the component is investigated.

Hereinafter, various exemplary embodiments will be explained in detail with reference to the accompanying drawings. In the following description and the various drawings, same or corresponding parts will be assigned same reference numerals, and redundant description thereof will be omitted. Further, ratios of sizes in the respective drawings do not necessarily coincide with ratios of sizes to be described. "Up," "down," "left," and "right" are based on an illustrated state, and are defined for the convenience of explanation.

FIG. 1 is a diagram illustrating an example of a processing system. The processing system 1 shown in FIG. 1 is equipped with a processing apparatus configured to process a target object, a transfer device configured to transfer the target object to the processing apparatus, and an inspection system (an example of a system) configured to inspect the processing apparatus. The target object is a disk-shaped object as a target of a processing by the processing apparatus. For example, the target object is a wafer. The target object may have an inclined peripheral portion (bevel). A treatment or a plasma processing may or may not be already performed on the wafer.

The processing system 1 is equipped with stages 2a to 2d, receptacles 4a to 4d, a loader module LM, load lock chambers LL1 and LL2, process modules PM1 to PM6 and a transfer chamber TC.

The stages 2a to 2d are arranged along one side of the loader module LM. The receptacles 4a to 4d are mounted on the stages 2a to 2d, respectively. Each of the receptacles 4a to 4d is configured to accommodate wafers W therein.

The loader module LM has a chamber wall which forms and confines therein a transfer space in an atmospheric pressure state. The loader module LM is equipped with a transfer robot TU1 in this transfer space. The transfer robot TU1 is configured to transfer the wafers W between the receptacles 4a to 4d and the load lock chambers LL1 and LL2.

The load lock chambers LL1 and LL2 are provided between the loader module LM and the transfer chamber TC. Each of the load lock chambers LL1 and LL2 provides a preliminary decompression chamber.

The transfer chamber TC is connected to the load lock chambers LL1 and LL2 via gate valves. The transfer chamber TC is configured as an evacuable decompression chamber, and a transfer robot TU2 is accommodated in this decompression chamber. The transfer robot TU2 is configured to transfer the wafer W between the load lock chambers LL1 and LL2 and the process modules PM1 to PM6 and between any two of the process modules PM1 to PM6.

The process modules PM1 to PM6 are connected to the transfer chamber TC via respective gate valves. Each of the process modules PM1 to PM6 is a processing apparatus configured to perform a certain processing such as a plasma processing on the wafer W.

In the processing system 1, a series of operations when a processing is performed on the wafer W are as follows, for example. The transfer robot TU1 of the loader module LM takes out the wafer W from one of the wafer receptacles 4a to 4d and transfers the wafer W into either one of the load lock chambers LL1 and LL2. Then, the corresponding load lock chamber is decompressed to a preset pressure. Subsequently, the transfer robot TU2 of the transfer chamber TC takes out the wafer W from this load lock chamber and transfers the wafer W into any one of the process modules PM1 to PM6. The wafer W is processed by one or more of the process modules PM1 to PM6. Thereafter, the transfer robot TU2 transfers the wafer W after being processed into either one of the load lock chambers LL1 and LL2 from the process module. Then, the transfer robot TU1 transfers the wafer W from the corresponding load lock chamber into any one of the receptacles 4a to 4d.

The substrate processing system 1 is further equipped with a control device MC. The control device MC may be a computer including a processor, a storage device such as a memory, a display device, an input/output device, a communication device, and so forth. The above-described series of operations of the processing system 1 are implemented under the control of the control device MC over the individual components of the processing system 1 according to a program stored in the storage device.

Figure 2:
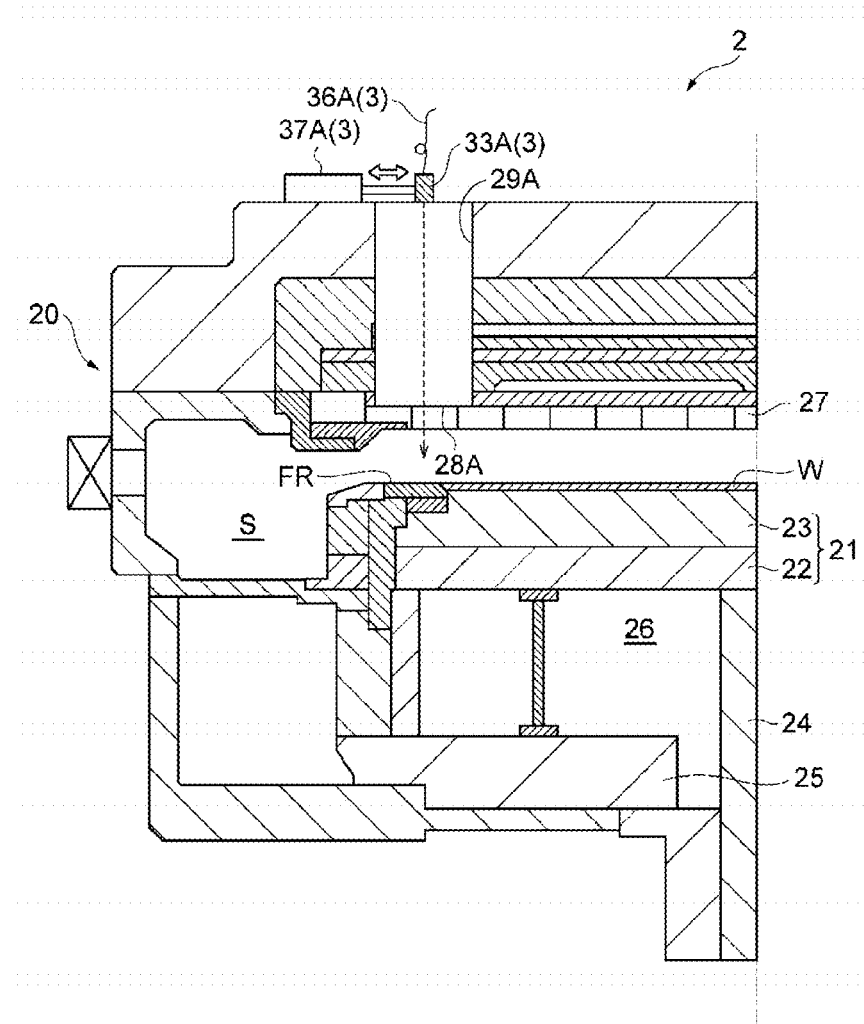
FIG. 2 is a longitudinal cross sectional view schematically illustrating a configuration of major components of a processing apparatus according to an exemplary embodiment.

Now, a processing apparatus 2 as an example of the process modules PM1 to PM6 will be discussed. FIG. 2 is a longitudinal cross sectional view schematically illustrating a configuration of major components of a processing apparatus according to the exemplary embodiment. As depicted in FIG. 2, the processing apparatus 2 is equipped with a processing vessel 20 configured to accommodate therein the wafer W and process the wafer W by plasma.

The processing vessel 20 forms and confines a processing chamber S therein. The processing chamber S is configured to be evacuable. A placing table 21 for placing the wafer W thereon is provided in the processing chamber S. The placing table 21 is made of a conductive material. The placing table 21 is equipped with a RF plate 22 to which a high frequency power is applied; and an electrostatic chuck device 23 provided on the RF plate 22 and configured to attract the wafer W. A power feed rod 24 electrically connected with a high frequency power supply (not shown) is connected to a central portion of the RF plate 22.

A focus ring FR is disposed on the placing table 21, surrounding the placing table 21. The focus ring FR is an annular member. The focus ring FR is configured to improve in-surface uniformity of a plasma processing upon the wafer W. The focus ring FR may be separated from the placing table 21 and replaced by a new focus ring FR in maintenance.

A base plate 25 is provided at a bottom portion of the processing vessel 20. A clearance 26 is provided between the RF plate 22 and the base plate 25. This clearance 26 is set to have an enough width to insulate the RF plate 22 and the base plate 25. Further, a driving mechanism (not shown) for a pusher pin (not shown) is provided in the clearance 26. The pusher pin receives the wafer W from a transfer arm such as the transfer robot TU2 and places the received wafer W on the placing table 21. The pusher pin lifts up the wafer W from the placing table 21 and hands it over to the transfer arm. Furthermore, the clearance 26 is not in a vacuum atmosphere but in an atmospheric atmosphere.

A facing electrode 27 (an example of an upper electrode) is provided above the placing table 21 at a certain distance from the placing table 21. The facing electrode 27 is configured as a so-called shower head. The facing electrode 27 is configured to supply a preset processing gas onto the wafer W placed on the placing table 21 in a shower shape. The facing electrode 27 is set to have a ground potential, or a high frequency power is applied thereto. The plasma is formed within the processing chamber S by the placing table 21, the RF plate 22 and the facing electrode 27. The placing table 21, the RF plate 22 and the facing electrode 27 are members configured to form the plasma within the processing chamber S and serve as a heating mechanism (an example of a temperature adjusting device) configured to apply heat to a component within the processing chamber S. The component within the processing chamber S is a component constituting the processing chamber S or a component arranged within the processing chamber S. As an example, the component within the processing chamber S is at least one of the placing table 21, the focus ring FR and the facing electrode 27. The heating mechanism may be a non-illustrated heater or the like.

A first window 28A is formed at an upper portion of the facing electrode 27. The first window 28A is formed downwards from an upper portion of the processing vessel 20. The first window 28A is optically transmissive and has a hermetically sealed structure. The processing vessel 20 is provided with a first through hole 29A corresponding to the first window 28A. The first window 28A and the first through hole 29A constitute a first light introduction path through which a measurement light is irradiated to the processing chamber S. In the following, the first light introduction path will also be referred to as "port 1".

A first focuser 33A (an example of an optical element) as a constituent component of an inspection system 3 to be described later is disposed at an upper end of the first through hole 29A. The first focuser 33A is connected to a light source via a first optical fiber 36A. The first focuser 33A irradiates the measurement light to the processing chamber S through the first through hole 29A and the first window 28A. The first focuser 33A may be connected with a first actuator 37A which is configured to move the first focuser 33A in a horizontal direction to allow the first focuser 33A to scan in this horizontal direction. The first actuator 37A is an electrically controllable driving device, for example, a step motor.

In the processing vessel 20, multiple light introduction paths having the same configuration as the above-described first light introduction path are arranged along a circumferential direction of the placing table 21 and the focus ring FR. By way of example, a non-illustrated second window 28B and a non-illustrated second through hole 29B are provided as a second light introduction path. In the following description, the second light introduction path will also be referred to as "port 2". By way of example, a non-illustrated third window 28C and a non-illustrated through hole 29C are provided as a third light introduction path. In the following, the third light introduction path will also be referred to as "port 3." A second focuser 33B (an example of the optical element) and a third focuser 33C (an example of the optical element) are disposed in the second light introduction path and the third light introduction path, respectively. As stated, the multiple sets each consisting of the window, the through hole and the focuser are provided at the upper portion of the facing electrode 27.

Figure 3:
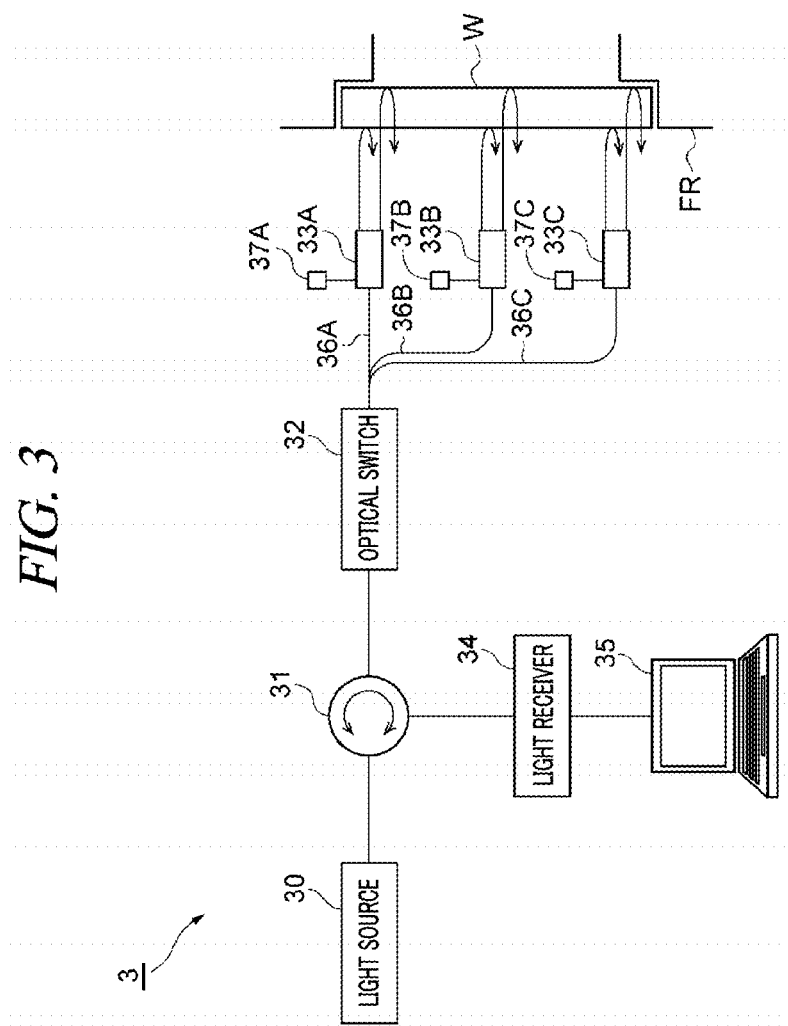
FIG. 3 is a configuration view illustrating an example of a position detection system according to the exemplary embodiment.

Now, an inspection system included in the processing apparatus 2 will be explained. FIG. 3 is a configuration view illustrating an example of the inspection system according to the exemplary embodiment. The inspection system 3 is a system configured to determine abnormality of the processing apparatus 2 by using reflection light interference. As depicted in FIG. 3, the inspection system 3 includes, in addition to the above-described heating mechanism, a light source 30, an optical circulator 31, an optical switch 32, the first focuser 33A, the second focuser 33B, the third focuser 33C and a light receiver 34 (an example of a light receiving element). The inspection system 3 may include two focusers or more than three focusers. The light receiver 34 is connected to an operation device 35 (an example of a controller). The operation device 35 may be a computer including a processor, a storage device such as a memory, a display device, an input/output device, a communication device, and so forth. A series of operations of the inspection system 3 to be described later are carried out under the control of the operation device 35 over the individual components of the inspection system 3 according to a program stored in the storage device. The operation device 35 and the control device MC shown in FIG. 1 may be configured as a single body. Further, the light source 30, the optical circulator 31, the optical switch 32, the first focuser 33A, the second focuser 33B, the third focuser 33C and the light receiver 34 are connected by using optical fibers.

The light source 30 is configured to emit measurement light having a wavelength penetrating an object placed in a measurement environment. By way of example, a wavelength-sweep light source is used as the light source 30. The object placed in the measurement environment may have, by way of example, a plate shape, and has a front surface and a rear surface opposite to the front surface. By way of non-limiting example, this object as a measurement target is the target object (wafer W), or a part (component) of the processing apparatus 2 such as the focus ring FR or the facing electrode 27. The measurement target object is made of, by way of non-limiting example, Si (silicon), $SiO_2$ (quarts), $Al_2O_3$ (sapphire), or the like. An example of the measurement light capable of penetrating the object made of such a material is infrared light.

The optical circulator 31 is connected to the light source 30, the optical switch 32 and the light receiver 34. The optical circulator 31 propagates the measurement light emitted from the light source 30 to the optical switch 32. The optical switch 32 has one input terminal and three output terminals. The input terminal is connected to the optical circulator 31. The three output terminals are connected to the first focuser 33A, the second focuser 33B and the third focuser 33C via the first optical fiber 36A, an optical fiber 36B and an optical fiber 36C, respectively. The optical switch 32 is configured to change an output destination. The optical switch 32 receives the light from the optical circulator 31 through the input terminal and outputs the received light to the three output terminals alternately.

Each of the first focuser 33A, the second focuser 33B and the third focuser 33C outputs the measurement light emitted from the light source 30 as output light and receives reflected light. To elaborate, each of the first focuser 33A, the second focuser 33B and the third focuser 33C outputs the measurement light to a front surface of the wafer W. Each of the first focuser 33A, the second focuser 33B and the third focuser 33C outputs the measurement light, which is controlled to be a convergent ray to the wafer W. Each of the first focuser 33A, the second focuser 33B and the third focuser 33C then receives the reflected light from the wafer W. The reflected light includes reflected light from a rear surface as well as reflected light from the front surface. Each of the first focuser 33A, the second focuser 33B and the third focuser 33C outputs the received reflected light to the optical switch 32.

The inspection system 3 has a first mode in which abnormality is determined by measuring a height position of each part and a second mode in which abnormality is determined by measuring a temperature of each part.

Figure 4:
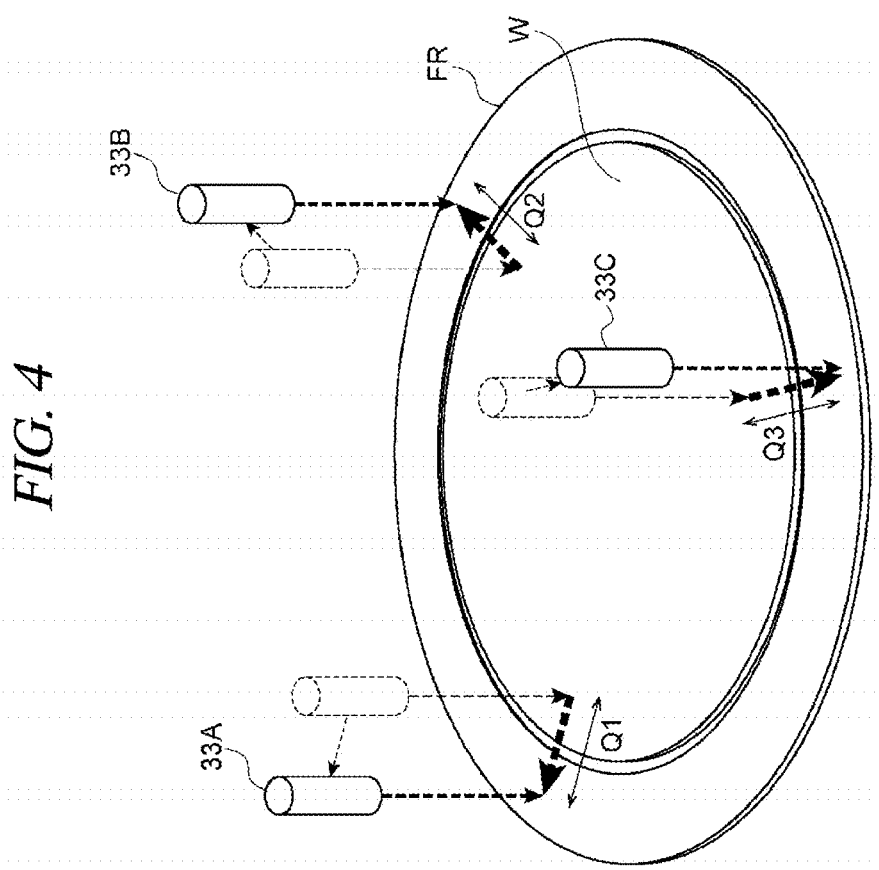
FIG. 4 is a diagram schematically illustrating an example of scanning using three focusers.

The inspection system 3 is equipped with a mechanism configured to move each focuser to carry out an inspection in the first mode. The first actuator 37A, a second actuator 37B and a third actuator 37C may be driven by the operation device 35. The first actuator 37A, the second actuator 37B and the third actuator 37C move the first focuser 33A, the second focuser 33B and the third focuser 33C, respectively, to allow the first focuser 33A, the second focuser 33B and the third focuser 33C to scan a preset scanning range. The first focuser 33A, the second focuser 33B and the third focuser 33C are allowed to scan the preset scanning range by the first actuator 37A, the second actuator 37B and the third actuator 37C, respectively. The scanning range is a range from the focus ring FR to the wafer W, and corresponds to, for example, a width of the first through hole 29A and the first window 28A shown in FIG. 2. FIG. 4 is a diagram schematically illustrating an example of scanning using the three focusers. As shown in FIG. 4, the first focuser 33A is configured to scan within a first scanning range Q1 extending in a diametrical direction. The second focuser 33B is configured to scan within a second scanning range Q2 extending in the diametrical direction at a position spaced apart from the first scanning range Q1 in the circumferential direction. The third focuser 33C is configured to scan within a third scanning range Q3 extending in the diametrical direction at a position spaced apart from the first scanning range Q1 and the second scanning range Q2 in the circumferential direction. A scanning direction may be a diametrically outward direction or a diametrically inward direction.

To carry out an inspection in the second mode, the inspection system 3 has a function of measuring a temperature during heating of each part. The first focuser 33A is capable of outputting the measurement light emitted from the light source 30, as the output light, to the component within the processing chamber S during the heating of the component within the processing chamber S by the heating mechanism, and capable of receiving reflected light. The second focuser 33B is capable of outputting the measurement light emitted from the light source 30, as the output light, to the component within the processing chamber S during the heating of the component within the processing chamber S by the heating mechanism, and capable of receiving reflected light. The third focuser 33C is capable of outputting the measurement light emitted from the light source 30, as the output light, to the component within the processing chamber S during the heating of the component within the processing chamber S by the heating mechanism, and capable of receiving reflected light.

If the inspection system 3 is configured to be able to perform only the second mode, the first actuator 37A, the second actuator 37B and the third actuator 37C may be omitted. In this case, the first focuser 33A, the second focuser 33B and the third focuser 33C are arranged to irradiate the measurement light to a single component within the processing chamber S.

Referring back to FIG. 3, the optical switch 32 outputs the reflected lights obtained by the first focuser 33A, the second focuser 33B and the third focuser 33C to the optical circulator 31 alternately. The optical circulator 31 outputs each received reflected light to the light receiver 34. The light receiver 34 measures a spectrum of the reflected light obtained from the optical circulator 31. The spectrum of the reflected light indicates an intensity distribution dependent on a wavelength or a frequency of the reflected light. The light receiver 34 outputs the spectrum of the reflected light to the operation device 35.

Figure 5:
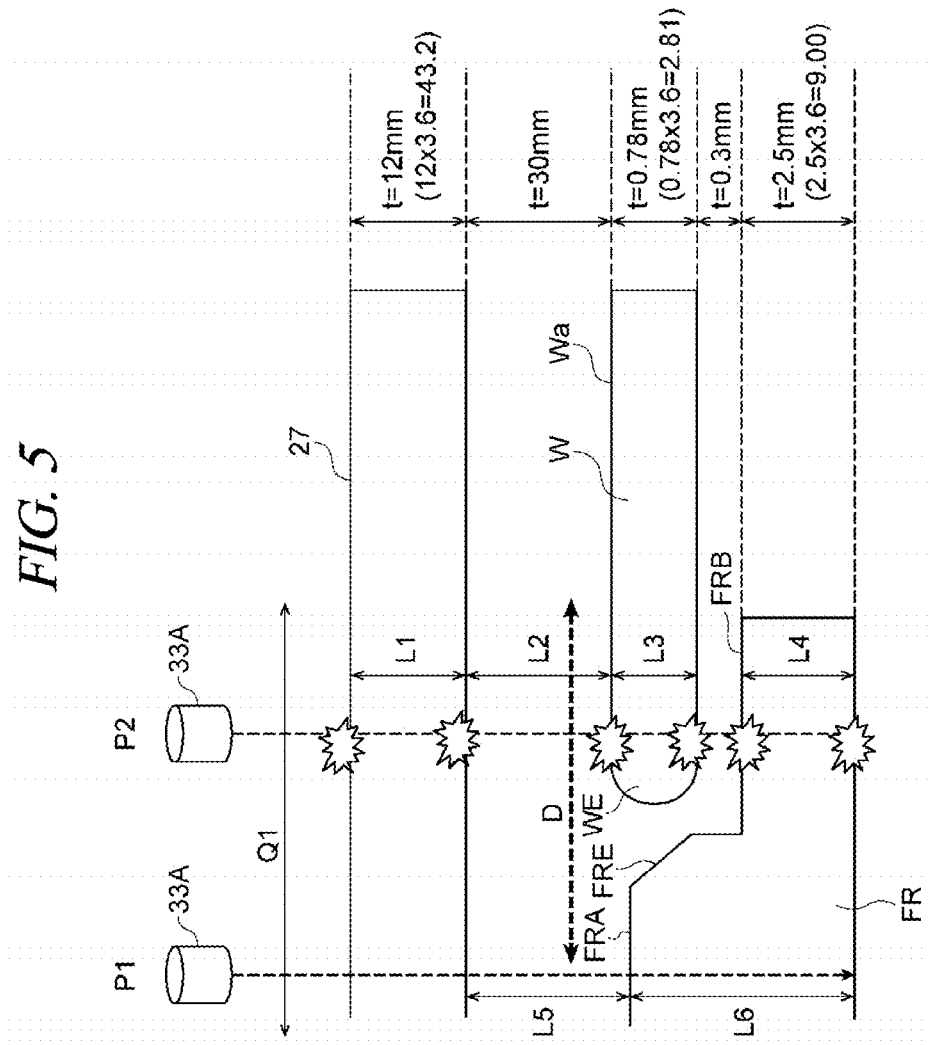
FIG. 5 is a diagram illustrating measurement points of the position detection system according to the exemplary embodiment.

When an inspection is performed in the first mode, the operation device 35 calculates, for each focuser, a positional relationship between the focus ring FR and the wafer W placed on the placing table 21 based on the reflected light in the scanning range. FIG. 5 is a diagram illustrating measurement points of the inspection system 3 according to the exemplary embodiment. As depicted in FIG. 5, the first focuser 33A will be explained as an example. The first focuser 33A is moved within the first scanning range Q1 ranging from the focus ring FR to the wafer W while outputting output light.

The output light outputted from the first focuser 33A is reflected by each part of the processing apparatus 2 or the wafer W. By way of example, the output light is reflected on a front surface and a rear surface of the facing electrode 27, the front surface and the rear surface of the wafer W, and a front surface and a rear surface of the focus ring FR. The inspection system 3 is capable of acquiring an interference spectrum obtained by interference of reflected lights at each scanning position.

Figure 6:
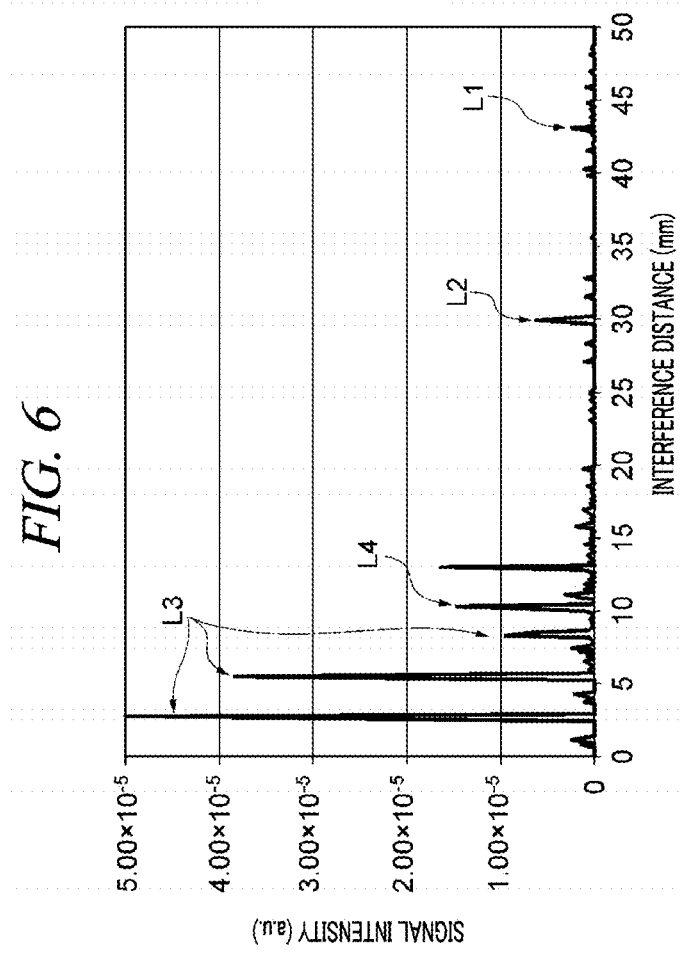
FIG. 6 presents an example of an interference spectrum corresponding to scanning positions of FIG. 5.

FIG. 6 presents an example of an interference spectrum corresponding to a scanning position P2 of FIG. 5. The interference spectrum shown in FIG. 6 is obtained by irradiating the measurement light having a wavelength of 1560 nm and a spot diameter of 0.1 mm from the first focuser 33A. In FIG. 6, a horizontal axis represents an interference distance (mm), and a vertical axis indicates an intensity (a.u). Further, the facing electrode 27, the focus ring FR and the wafer W are made of impurity-doped silicon. A peak of an interference distance L1 appears as the reflected lights from the front surface and the rear surface of the facing electrode 27 interfere with each other. A peak of an interference distance L2 appears as the reflected light from the rear surface of the facing electrode 27 and the reflected light from the front surface of the wafer W interfere with each other. A peak of an interference distance L3 appears as the reflected lights from the front surface and the rear surface of the wafer W interfere with each other. A peak of an interference distance L4 appears as the reflected lights from the front surface and the rear surface of the focus ring FR (a lower end portion FRB between two end portions of the focus ring FR).

The operation device 35 calculates a thickness or a distance in a light irradiation direction based on an interference distance at which a peak appears and a reflective index of a material of a measurement target object such as the facing electrode 27, the focus ring FR or the wafer W. The interference distance is expressed by a product of a reflective index n and an actual thickness d or distance, and is equivalent to an optical path length $nd_T$. By way of example, the operation device 35 calculates a thickness (12 mm) of the facing electrode 27 by dividing the interference distance L1 (43.2 mm) by a reflective index (3.6) of the impurity-doped silicon which is the material of the facing electrode 27. The operation device 35 calculates a gap distance (30 mm) between the rear surface of the facing electrode 27 and the front surface of the wafer W by dividing the interference distance L2 (30 mm) by a reflective index (1) of a vacuum. The operation device 35 calculates a thickness (0.78 mm) of the wafer W by dividing the interference distance L3 (2.81 mm) by a reflective index (3.6) of the impurity-doped silicon which is the material of the wafer W. The operation device 35 calculates a thickness (2.5 mm) of the lower end portion FRB of the focus ring FR by dividing the interference distance L4 (9.00 mm) by a reflective index (3.6) of the impurity-doped silicon which is the material of the focus ring FR.

The operation device 35 performs the same operations as those of the scanning position P2 at a scanning position P1 by using an interference spectrum obtained at the scanning position P1. That is, the operation device 35 performs the above-described operations at the individual scanning positions based on the interference spectrum obtained for each scanning position within the first scanning range Q1. The operation device 35 is also capable of operating a displacement of the thickness and the distance in a horizontal direction by plotting the information upon the thickness and the distance calculated in the first scanning range Q1 in a scanning direction. Further, the operation device 35 is also capable of calculating the positional relationship between the focus ring RF and the wafer W. The positional relationship implies a distance D between the focus ring FR and the wafer W in the horizontal direction, a displacement amount of a center of each of the focus ring FR and the wafer W, a difference in a surface height of each of the focus ring FR and the wafer W, and so forth.

Figure 7:
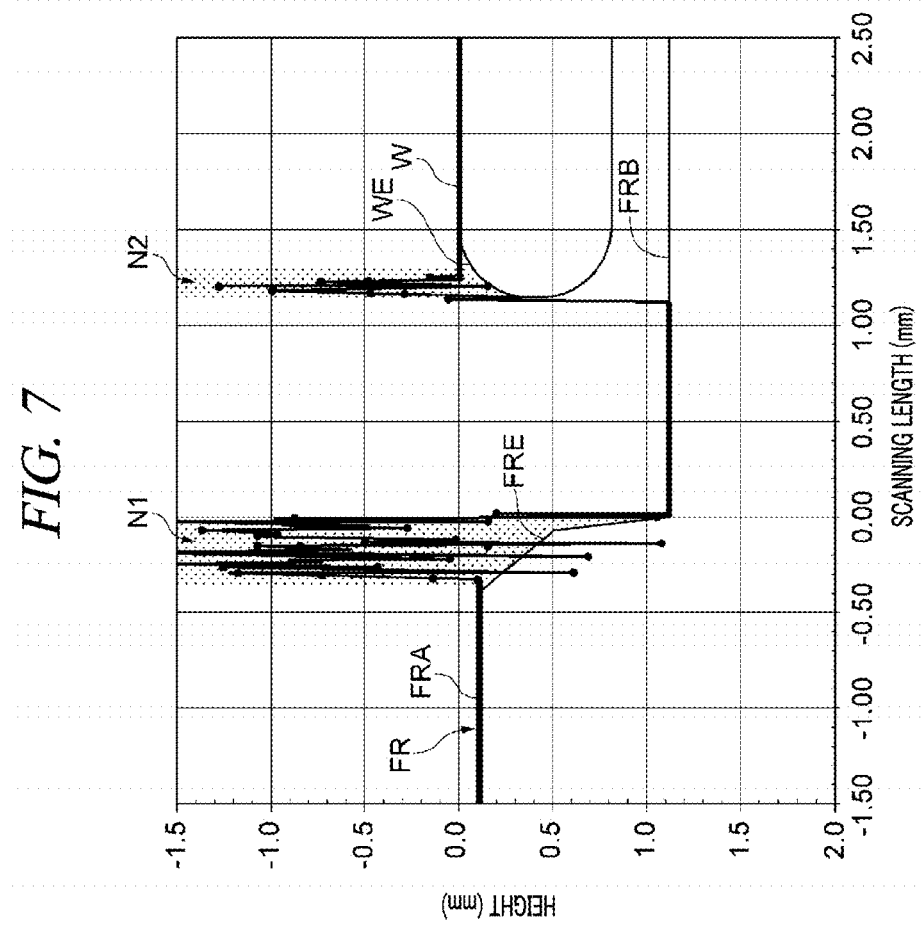
FIG. 7 provides height information in a scanning zone calculated based on the interference spectrum of FIG. 6.

FIG. 7 presents height information in a scanning zone calculated based on the interference spectrum of FIG. 6. A horizontal axis of FIG. 7 indicates a scanning length (mm), which is expressed as a relative value with respect to an origin point (0 mm) (a boundary between an inclined surface FRE and the lower end portion FRB of the focus ring FR for convenience's sake). A vertical axis indicates a height (mm), which is expressed as a relative value with respect to an origin point (0 mm) (a height of a top surface of the wafer W for convenience's sake). Heights calculated by the operation device 35 are indicated by thick solid lines. Further, in FIG. 7, positions of the individual parts of the processing apparatus 2 are indicated by thin solid lines to match with measurement results. As depicted in FIG. 7, noises N1 and N2 are generated at the inclined surface FRE of the focus ring FR and a peripheral portion WE of the wafer W. However, surface heights of a flat portion of the wafer W and a flat portion (an upper end portion FRA and the lower end portion FRB) of the focus ring FR are calculated accurately.

The operation device 35 extracts height information of the flat portion of the wafer W and height information of the flat portion (the upper end portion FRA and the lower end portion FRB) of the focus ring FR from the height information in the scanning zone, and performs linear interpolation. In this way, by calculating the height information from which the noises N1 and N2 are removed, the operation device 35 calculates the positional relationship between the focus ring FR and the wafer W.

If an inspection is performed in the second mode, the operation device 35 fixes a position of each focuser, and calculates a temperature of a component at each measurement point corresponding to each focuser based on reflected light. The position of the first focuser 33A is fixed to, for example, the scanning position P2 of FIG. 5. Then, the interference spectrum shown in FIG. 6 is obtained. The operation device 35 calculates a thickness or a distance in the light irradiation direction based on an interference distances at which a peak appears and a reflective index of a material of a measurement target object such as the facing electrode 27, the focus ring FR or the wafer W, the same as in the first mode. The operation device 35 calculates a temperature by using a calculated optical path length and previously obtained temperature correction data indicating a relationship between the optical path length and the temperature.

The temperature correction data is previously obtained for each measurement target object. In the following, an example of creating the temperature correction data previously will be explained. By way of example, measurement is made by using a blackbody furnace for a temperature control. A temperature T and an optical path length $nd_T$ at the temperature T are measured at the same time. The temperature T is measured by using a thermometer such as a thermocouple. Further, the optical path length $nd_T$ is measured by using the above-described method using the FFT. Then, the optical path length $nd_T$ is standardized by setting an optical path length $nd_{40}$ when a measurement value of the thermometer is 40° C. to be 1000. Then, by approximating the temperatures and the standardized optical path lengths $nd_T$ with a cubic expression for every division of 100° C., a coefficient of an approximation curve is obtained. A function of the standardized optical path length $nd_T$ dependent on the temperature T is represented by the following expression.

[Expression 1]

$$f(T) = \frac{n \cdot d_T}{n \cdot d_{40}}$$

Further, an inverse function of f(T) is expressed as follows.

[Expression 2]

$$T = f^{-1}\left(\frac{n \cdot d_T}{n \cdot d_{40}}\right) \quad (1)$$

The optical path length $nd_{40}$ is calculated by the following expression based on an initial temperature T0 and an optical path length $nd_{T0}$ at this temperature.

[Expression 3]

$$n \cdot d_{40} = \frac{n \cdot d_{T0}}{f(T0)} \quad (2)$$

The temperature T is calculated by using the aforementioned expression 1 based on the optical path length $nd_{40}$ obtained based on the expression (2) and the optical path length $nd_T$.

The operation device 35 carries out the above-stated temperature measurement while heating the component as the measurement target object. By way of example, the inspection system 3 begins heating and measuring by generating plasma or turning a heater on. Accordingly, the operation device 35 is capable of acquiring a time-series temperature variation of the measurement point. The operation device 35 performs the same processing as that of the first focuser 33A for the second focuser 33B and the third focuser 33C, and calculates temperatures of the individual components.

The operation device 35 determines abnormality of the processing apparatus 2 based on comparisons of the temperatures of the components of the measurement points. As an example, the operation device 35 compares a temperature measurement result of the first focuser 33A, a temperature measurement result of the second focuser 33B and a temperature measurement result of the third focuser 33C which are obtained at a same time. In case that there is a temperature discrepancy depending on the measurement points even if the same component is concerned, an assembly error or a problem of the heating mechanism may be assumed. That is, this indicates a state in which the processing apparatus 2 is abnormal. The operation device 35 determines, as an example, whether a difference between the first focuser 33A and the second focuser 33B is equal to or larger than threshold value. The threshold value is a previously set value for determining occurrence of abnormality. The operation device 35 may determine whether a difference between the first focuser 33A and the third focuser 33C is equal to or larger than the threshold value. The operation device 35 may determine whether a difference between the second focuser 33B and the third focuser 33C is equal to or larger than the threshold value. If any one of these differences is found to be equal to or larger than the threshold value, the operation device 35 makes a determination that the processing apparatus 2 is abnormal. If it is determined that the abnormality exists, the operation device 35 displays on a non-illustrated display device, or output an alarm sound from a non-illustrated speaker.

Figure 8:
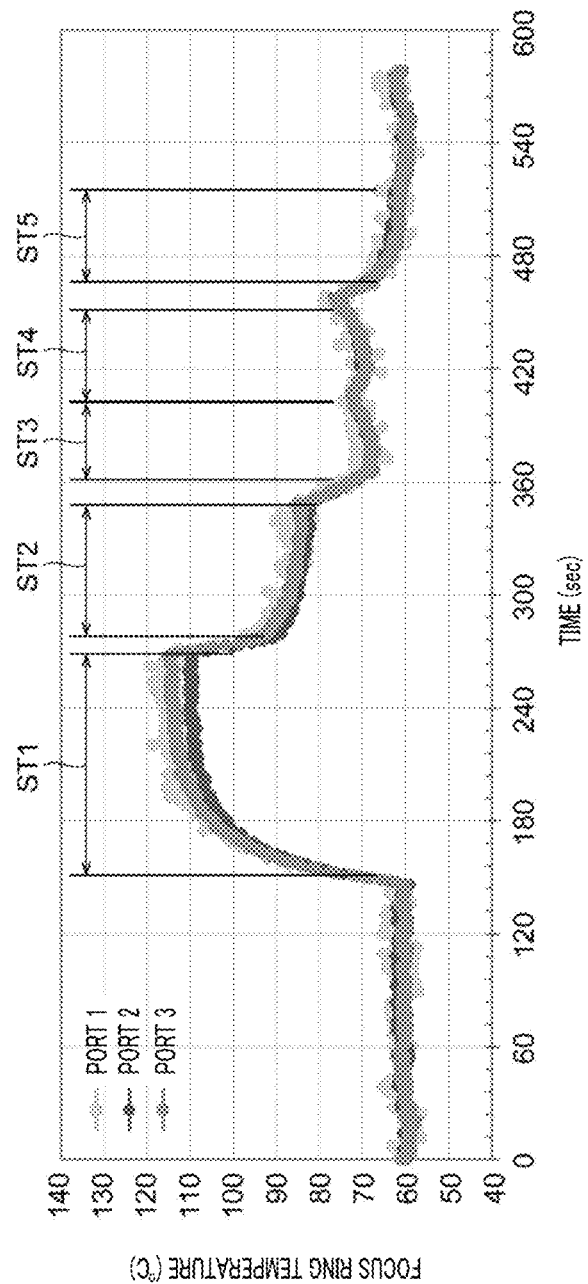
FIG. 8 is a diagram illustrating an example temperature variation of a focus ring.

The operation device 35 is capable of performing the above-described measurement during a processing of the wafer W. FIG. 8 is a diagram illustrating an example of a temperature variation of the focus ring. A horizontal axis of a graph shown in FIG. 8 indicates a time, and a vertical axis thereof represents a focus ring temperature. FIG. 8 presents temperature measurement results of the port 1, the port 2 and the port 3. The processing apparatus 2 performs processes ST1 to ST5 as the processing of the wafer W. FIG. 8 shows temperature measurement results of the focus ring in periods including the processes ST1 to ST5. In each process, plasma is formed in the processing chamber S. Conditions for forming the plasma are different in the processes ST1 to ST5. By way of example, values of high frequency powers applied to the placing table 21 and the facing electrode 27 or a DC power value applied to the placing table 21 or the facing electrode 27 may be different. For the reason, the plasma is changed in each process, and a heat amount applied to the component is differed in the individual processes.

Figure 9:
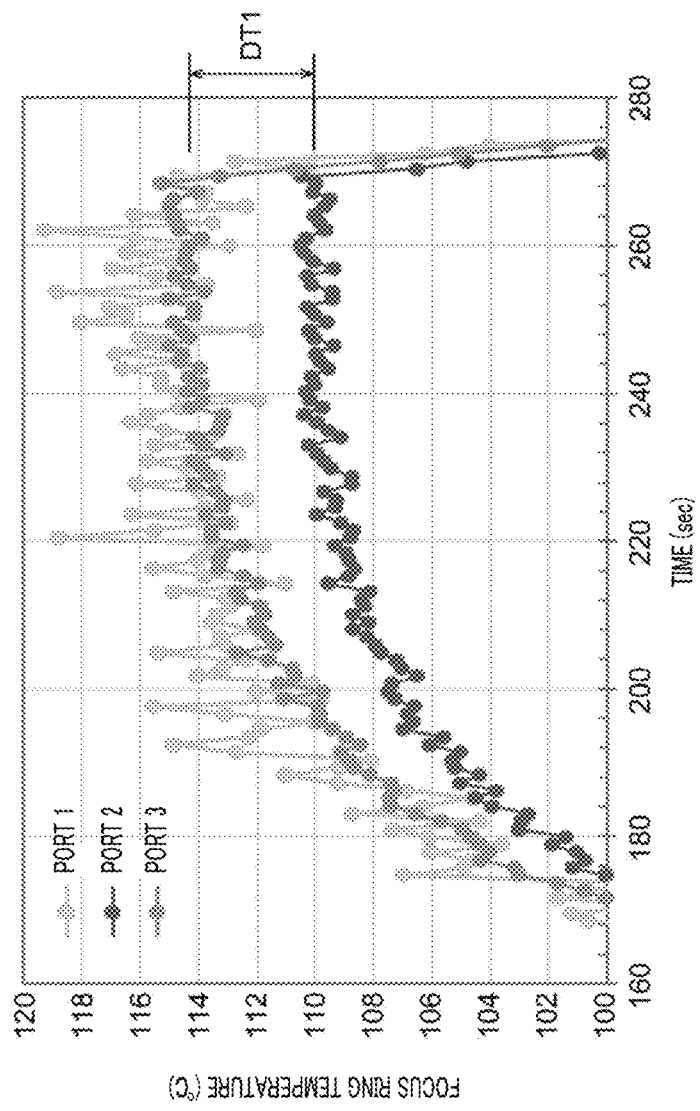
FIG. 9 is a partially enlarged view of FIG. 8.

FIG. 9 is a partially enlarged view of FIG. 8. FIG. 9 provides an enlargement of a result in a period of the process ST1 of FIG. 8. As depicted in FIG. 9, the ports 1 and 3 show a substantially same temperature variation. However, the port 2 has a difference as compared to the ports 1 and 3. The operation device 35 may calculate the difference every set time and make a determination upon the difference. Alternatively, the operation device 35 may average differences obtained at the respective set times and make a determination upon this average difference. Still alternatively, the operation device 35 may calculate a difference between a maximum value and a minimum value in the all ports at a final time of the process ST1, and make a determination upon the calculated difference. The operation device 35 may make a determination upon a maximum difference in the process ST1. FIG. 9 shows a difference DT1 between the maximum value and the minimum value at a process end time. If the difference DT1 is equal to or large than the preset threshold value, the operation device 35 makes a determination indicating abnormality of the apparatus.

Figure 10:
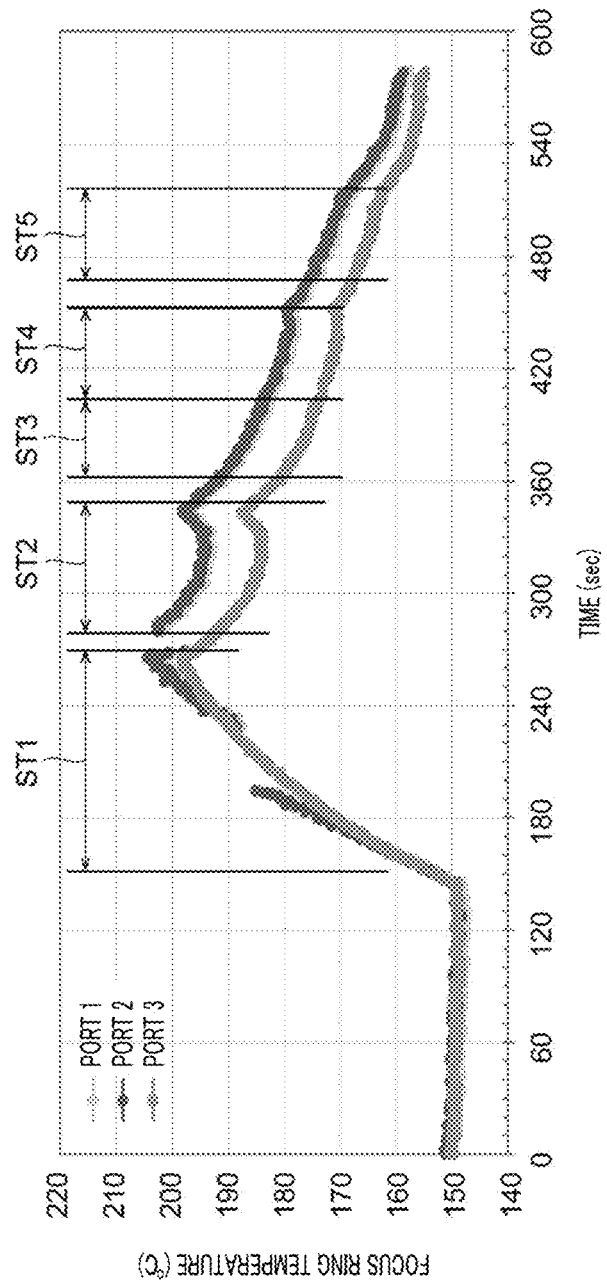
FIG. 10 is a diagram illustrating an example temperature variation of a facing electrode obtained at the same timings as those of FIG. 8.

FIG. 10 is a diagram showing an example of a temperature variation of the facing electrode obtained at the same timings as those of FIG. 8. A horizontal axis of a graph shown in FIG. 10 represents a time, and a vertical axis thereof indicates a facing electrode temperature. FIG. 10 presents a temperature measurement result of each of the ports 1 to 3. The processes ST1 to ST5 shown in FIG. 10 are the same as those described in FIG. 8.

Figure 11:
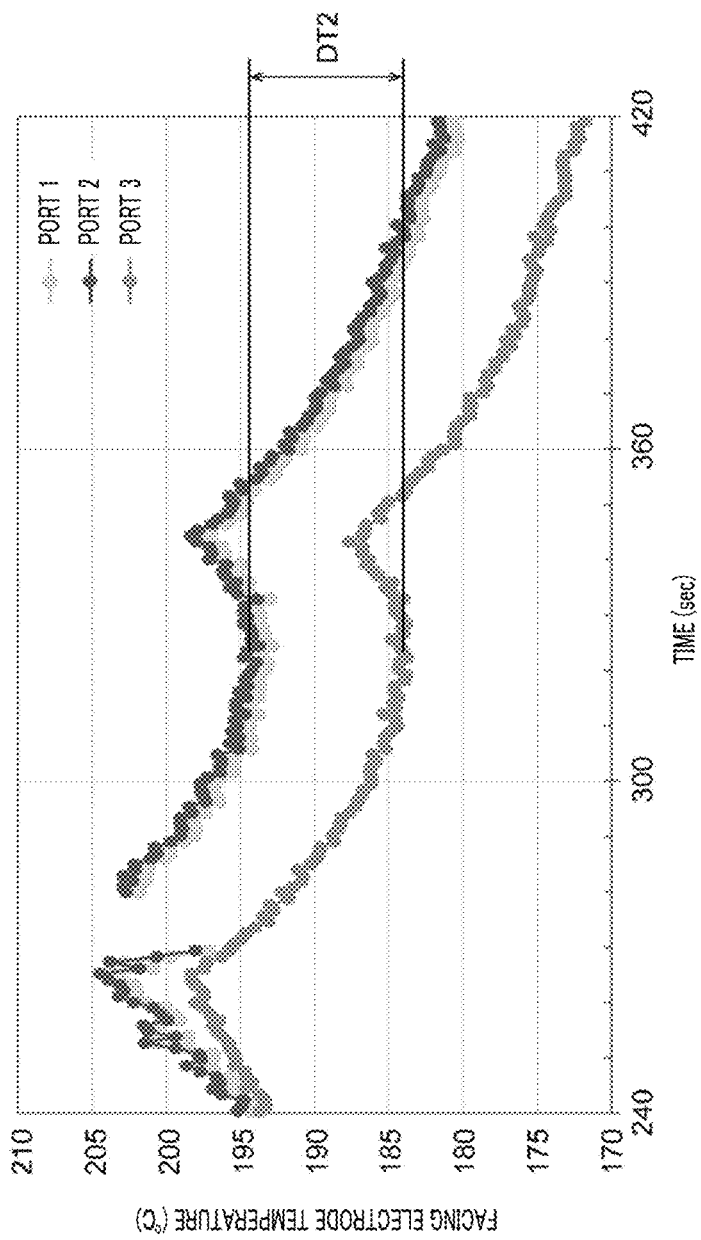
FIG. 11 is a partially enlarged view of FIG. 10.

FIG. 11 is a partially enlarged view of FIG. 10. FIG. 11 presents an enlargement of results in periods of the process ST2 and the process ST3 of FIG. 10. As depicted in FIG. 11, the port 1 and the port 2 show a substantially same temperature variation. However, the port 3 has a difference as compared to the ports 1 and 2. The operation device 35 may calculate the difference every set time and make a determination upon the difference. Alternatively, the operation device 35 may average differences obtained at the respective set times and make a determination upon this average difference. Still alternatively, the operation device 35 may calculate a difference between a maximum value and a minimum value in the all ports at a final time of the process, and make a determination upon the calculated difference. The operation device 35 may make a determination upon a maximum difference in the process. FIG. 11 shows a maximum difference DT2 in the process ST2. If the difference DT2 is equal to or larger than the preset threshold value, the operation device 35 makes a determination indicating abnormality of the apparatus.

Figure 12:
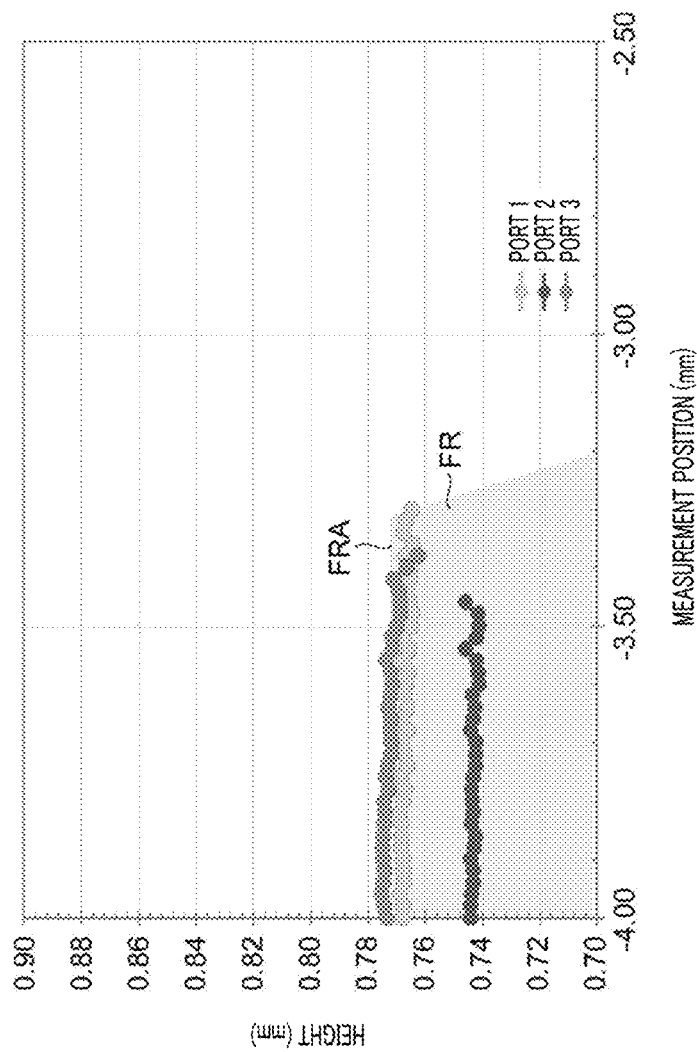
FIG. 12 provides a measurement result of a height of the focus ring as a target of temperature measurement of FIG. 8.
Figure 13:
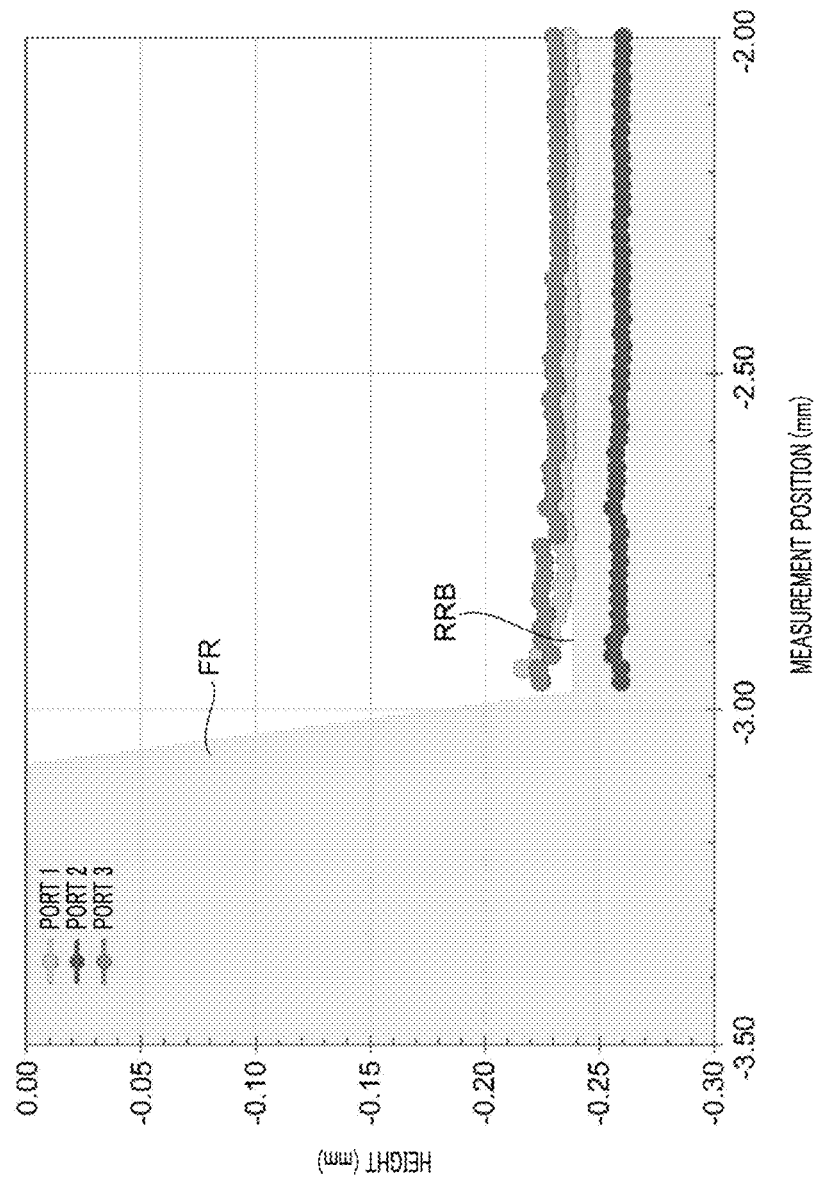
FIG. 13 presents a measurement result of the height of the focus ring as the target of temperature measurement of FIG. 8.
Figure 14:
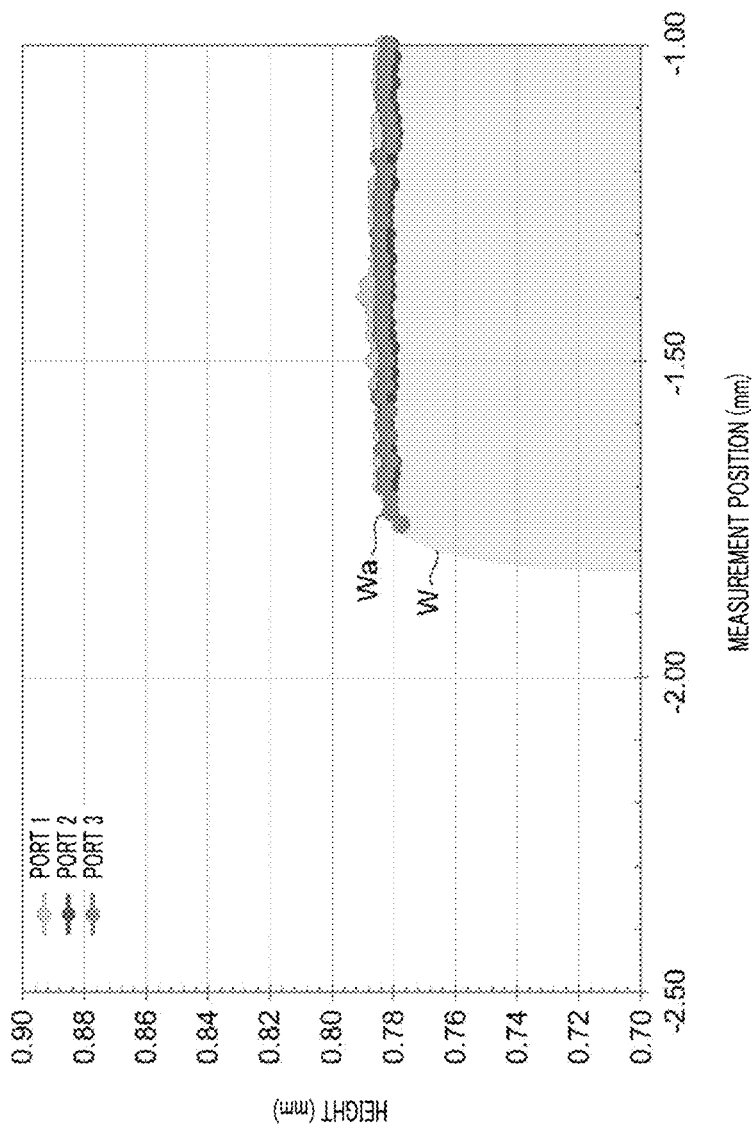
FIG. 14 provides a measurement result of a height of a wafer.

The operation device 35 may output a determination result by combining the inspection in the first mode and the inspection in the second mode. The operation device 35 measures, in the first mode, the focus ring FR which is the target of the temperature measurement of FIG. 8. FIG. 12 shows a height measurement result of the focus ring which is the target of the temperature measurement of FIG. 8. A horizontal axis represents a measurement position, and a vertical axis indicates a height. The height is calculated by using a height of the placing table 21 as a reference (0 mm). FIG. 12 shows a height of the focus ring FR, the flat portion (upper end portion FRA) of the focus ring FR and measurement results of the ports 1 to 3. As depicted in FIG. 12, the port 1 and the port 3 measure the height of the upper end portion FRA of the focus ring FR accurately. However, a height position at the port 2 is different from those of the ports 1 and 3. FIG. 13 shows a height measurement result of the focus ring which is the target of the temperature measurement of FIG. 8. A horizontal axis represents a measurement position, and a vertical axis indicates a height. The height is calculated by using the height of the placing table 21 as the reference (0 mm). FIG. 13 shows a height of the focus ring FR, the flat portion (lower end portion FRB) of the focus ring FR and measurement results of the ports 1 to 3. As depicted in FIG. 13, the port 1 and the port 3 measure the height of the lower end portion FRB of the focus ring FR accurately. However, a height position at the port 2 is different from those of the ports 1 and 3. FIG. 14 provides a height measurement result of the wafer W. A horizontal axis represents a measurement position, and a vertical axis indicates a height. The height is calculated by using the height of the placing table 21 as the reference (0 mm). In FIG. 14, all ports measure an upper surface Wa of the wafer W accurately. By combining the inspection result in the first mode and the inspection result in the second mode, the operation device 35 may assume that there is an assembly error in the focus ring FR as the measurement point of the port 2 and this assembly error has caused the temperature difference.

In case of combining the inspection in the first mode and the inspection in the second mode, the operation device 35 may perform the inspection in the first mode, and then perform the inspection in the second mode if it is determined in the inspection in the first mode that there is no abnormality of the apparatus. In this case, presence or absence of abnormality may be first roughly determined by checking a height of a component, and then determined in detail by checking a temperature difference. Accordingly, abnormality of the apparatus can be determined promptly.

So far, the various exemplary embodiments have been described. However, the exemplary embodiments are not limiting, and various omissions, substitutions and changes may be made. Further, other exemplary embodiments may be embodied by combining elements in the various exemplary embodiments in a variety of other forms. By way of example, the optical element is not limited to the focuser. The optical element is not particularly limited as long as it has a function of irradiating light to a target object and receiving reflected light therefrom. By way of example, the optical element may be a collimator or the like. Further, a SLD (Super Luminescent Diode) may be used as the light source 30, and in this case, a spectroscope is used as the light receiver.

In the exemplary embodiments, the heating mechanism is used as the example of the temperature adjusting device. However, a cooling mechanism may be used as the temperature adjusting device, and abnormality of the processing apparatus may be determined during a cooing processing. An example of the cooling mechanism may be a chiller. A path is formed in a component as a target of temperature adjustment, and the component is cooled by circulating a coolant in the path. Further, the heating mechanism is not limited to the plasma generation device or the heater mentioned in the above-described exemplary embodiment, and may be the chiller. When the chiller is used as the heating mechanism, the component may be heated by circulating a high-temperature fluid in the aforementioned path.

According to the exemplary embodiment, it is possible to provide the method and the system capable of determining abnormality of the processing apparatus accurately.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A system configured to inspect a processing apparatus, comprising:
   a temperature adjusting device configured to adjust a temperature of a component within a processing chamber of the processing apparatus;
   a light source configured to emit measurement light;
   multiple optical elements configured to output the measurement light emitted from the light source to the component within the processing chamber of the processing apparatus as output light and configured to receive reflected light from the component during a temperature adjustment of the component by the temperature adjusting device;
   a light receiving element configured to receive the light from the multiple optical elements and measure a spectrum of the light; and
   a controller configured to calculate temperatures of the component at measurement points respectively corresponding to the multiple optical elements based on the spectrum of the light measured by the light receiving element, and make a determination upon abnormality of the processing apparatus based on comparisons of the temperatures of the component at the respective measurement points,
   wherein the temperatures are obtained from the same component at a same time.

2. The system of claim 1,
   wherein the component is at least one of a substrate, a focus ring configured to surround the substrate, or an upper electrode disposed above the focus ring, and
   the component is made of silicon.

3. The system of claim 1,
   wherein the controller compares the temperatures of the component at the respective measurement points, and makes a determination that the processing apparatus is abnormal when a difference between the temperatures is equal to or larger than a threshold value.

4. The system of claim 1,
   wherein the temperature adjusting device is a device configured to form plasma within the processing chamber of the processing apparatus.

5. The system of claim 1,
   wherein the controller measures, based on the reflected light, positions of the component in a height direction for the measurement points corresponding to the multiple optical devices, and makes a determination upon the abnormality of the processing apparatus based on comparisons of the positions of the component in the height direction at the respective measurement points, and
   when it is determined that the processing apparatus has no abnormality based on the positions of the component in the height direction, the controller makes the determination upon the abnormality of the processing apparatus based on the comparisons of the temperatures of the component at the respective measurement points.

6. The system of claim 1,
   wherein the controller obtains a time-series temperature variation of the respective measure points.

7. The system of claim 1,
   wherein the controller calculates a difference between the temperatures of the component at the respective measurement points every set time, and if the difference is equal to or larger than a threshold value, makes the determination that the abnormality of the processing apparatus exists.

8. The system of claim 1,
   wherein at least one of the measurement points is at a periphery of a substrate.

9. The system of claim 1,
   wherein if it is determined that the abnormality of the processing apparatus exists, the controller displays the abnormality on display device or outputs an alarm sound from a speaker.

10. The system of claim 1,
    wherein the temperature adjusting device is a cooling device.

11. A method, comprising:
    irradiating measurement light to multiple measurement points of a same component within a processing chamber of a processing apparatus during a temperature adjustment of the processing chamber; and
    calculating temperatures of the component at the respective measurement points based on reflected light from the component, and making a determination upon abnormality of the processing apparatus based on comparisons of the temperatures of the component at the respective measurement points,
    wherein the temperatures are obtained from the same component at a same time.

12. A system configured to inspect a processing apparatus, comprising:
    a plasma generating apparatus configured to generate plasma within a processing chamber of the processing apparatus;
    a light source configured to emit measurement light;
    multiple optical elements configured to output the measurement light emitted from the light source to a component within the processing chamber of the processing apparatus as output light and configured to receive reflected light from the component during a plasma generation by the plasma generating apparatus;
    a light receiving element configured to receive the light from the multiple optical elements and measures a spectrum of the light; and
    a controller configured to calculate temperatures of the component at measurement points respectively corresponding to the multiple optical elements based on the spectrum of the light measured by the light receiving element, and make a determination upon abnormality of the processing apparatus based on comparisons of the temperatures of the component at the respective measurement points,
    wherein the temperatures are obtained from the same component at a same time.

13. The system of claim 12,
wherein the component is at least one of a substrate, a focus ring configured to surround the substrate, or an upper electrode disposed above the focus ring, and
the component is made of silicon.

14. The system of claim 12,
wherein the controller compares the temperatures of the component at the respective measurement points, and makes a determination that the processing apparatus is abnormal when a difference between the temperatures is equal to or larger than a threshold value.

15. The system of claim 12,
wherein the temperature adjusting device is a device configured to form plasma within the processing chamber of the processing apparatus.

16. The system of claim 12,
wherein the controller measures, based on the reflected light, positions of the component in a height direction for the measurement points corresponding to the multiple optical devices, and makes a determination upon the abnormality of the processing apparatus based on comparisons of the positions of the component in the height direction at the respective measurement points, and
when it is determined that the processing apparatus has no abnormality based on the positions of the component in the height direction, the controller makes the determination upon the abnormality of the processing apparatus based on the comparisons of the temperatures of the component at the respective measurement points.

17. The system of claim 12,
wherein the controller obtains a time-series temperature variation of the respective measure points.

18. The system of claim 12,
wherein the controller calculates a difference between the temperatures of the component at the respective measurement points every set time, and if the difference is equal to or larger than a threshold value, makes the determination that the abnormality of the processing apparatus exists.

19. The system of claim 12,
wherein at least one of the measurement points is at a periphery of a substrate.

20. The system of claim 12,
wherein if it is determined that the abnormality of the processing apparatus exists, the controller displays the abnormality on display device or outputs an alarm sound from a speaker.

21. The system of claim 12,
wherein the temperature adjusting device is a cooling device.

* * * * *